(12) United States Patent
Sim et al.

(10) Patent No.: US 10,658,538 B2
(45) Date of Patent: May 19, 2020

(54) OPTICAL DETECTION DEVICE

(71) Applicant: Electronics and Telecommunications Research Institute, Daejeon (KR)

(72) Inventors: Jae-Sik Sim, Sejong-si (KR); Kisoo Kim, Seoul (KR); Won Seok Han, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 47 days.

(21) Appl. No.: 15/956,107

(22) Filed: Apr. 18, 2018

(65) Prior Publication Data
US 2018/0309011 A1 Oct. 25, 2018

(30) Foreign Application Priority Data
Apr. 24, 2017 (KR) .................. 10-2017-0052529

(51) Int. Cl.
| | |
|---|---|
| H01L 31/107 | (2006.01) |
| H01L 31/02 | (2006.01) |
| H01L 31/18 | (2006.01) |
| H01L 31/0216 | (2014.01) |
| H01L 31/0304 | (2006.01) |
| H01L 31/0224 | (2006.01) |
| H01L 31/0352 | (2006.01) |

(52) U.S. Cl.
CPC ...... *H01L 31/107* (2013.01); *H01L 31/02027* (2013.01); *H01L 31/02161* (2013.01); *H01L 31/022408* (2013.01); *H01L 31/03042* (2013.01); *H01L 31/03529* (2013.01); *H01L 31/184* (2013.01)

(58) Field of Classification Search
None
See application file for complete search history.

(56) References Cited

U.S. PATENT DOCUMENTS

| | | | | |
|---|---|---|---|---|
| 6,794,631 | B2* | 9/2004 | Clark | ............... H01L 31/02027 250/214.1 |
| 8,008,688 | B2* | 8/2011 | Hu | ...................... H01L 31/1075 257/186 |
| 8,999,744 | B2 | 4/2015 | Park et al. | |
| 9,466,751 | B1 | 10/2016 | Shi | |
| 10,032,950 | B2* | 7/2018 | Campbell | ........... H01L 31/1075 |
| 2003/0226952 | A1* | 12/2003 | Clark | ............... H01L 31/02027 250/214.1 |
| 2009/0242934 | A1* | 10/2009 | Hu | ...................... H01L 31/1075 257/186 |

(Continued)

FOREIGN PATENT DOCUMENTS

| | | |
|---|---|---|
| KR | 10-2010-0065706 A | 6/2010 |
| KR | 101554290 B1 * | 9/2015 |
| KR | 10-1553817 B1 | 10/2015 |

*Primary Examiner* — Telly D Green
(74) *Attorney, Agent, or Firm* — Rabin & Berdo, P.C.

(57) ABSTRACT

Provided is an optical detection device including a first ohmic contact layer of a first conductivity type, a second ohmic contact layer of a second conductivity type, and first and second mesa structures stacked between the first and second ohmic contact layers. The first mesa structure includes an electric field buffer layer; and a diffusion layer formed in the electric field buffer layer. The second mesa structure includes a light absorbing layer and a grading layer on the light absorbing layer.

15 Claims, 7 Drawing Sheets

(56) References Cited

U.S. PATENT DOCUMENTS

| | | |
|---|---|---|
| 2011/0140168 A1* | 6/2011 | Sim .................... H01L 31/02327 257/186 |
| 2012/0156826 A1 | 6/2012 | Sim et al. |
| 2013/0153962 A1* | 6/2013 | Sim ....................... H01L 31/107 257/186 |
| 2014/0042581 A1* | 2/2014 | Mheen .............. H01L 31/02002 257/438 |
| 2014/0175511 A1* | 6/2014 | Sim .................... H01L 31/1075 257/186 |
| 2015/0115319 A1 | 4/2015 | Levine |
| 2017/0244002 A1* | 8/2017 | Campbell ......... H01L 21/02549 |
| 2018/0309011 A1* | 10/2018 | Sim ....................... H01L 31/107 |
| 2019/0280145 A1* | 9/2019 | Natsuaki ............... H01L 31/107 |

* cited by examiner

OPTICAL DETECTION DEVICE

CROSS-REFERENCE TO RELATED APPLICATIONS

This U.S. non-provisional patent application claims priority under 35 U.S.C. § 119 of Korean Patent Application No. 10-2017-0052529, filed on Apr. 24, 2017, the entire contents of which are hereby incorporated by reference.

BACKGROUND

The present disclosure relates to an optical detection device, and more particularly to an avalanche optical detection device.

Optical detection devices are used in optical communication systems and detect optical signals and convert them into electrical signals. As a typical optical detection device, there is a photodiode, and the photodiode includes a P-I-N photodiode, a PN photodiode, and an avalanche photodiode.

The avalanche photodiodes may generate a gain of signal by applying a high electric field and using avalanche amplification to generate holes or electrons.

SUMMARY

The present disclosure provides an optical detection device having the advantages of a mesa structure and a flat structure.

An embodiment of the inventive concept provides an optical detection device including: a first ohmic contact layer of a first conductivity type; a second ohmic contact layer of a second conductivity type; and first and second mesa structures stacked between the first and second ohmic contact layers, wherein the first mesa structure includes: an electric field buffer layer; and a diffusion layer formed in the electric field buffer layer, wherein the second mesa structure includes: a light absorbing layer; and a grading layer on the light absorbing layer.

In an embodiment, the first mesa structure may be disposed on the second mesa structure.

In an embodiment, a width of the second mesa structure may be larger than a width of the first mesa structure.

In an embodiment, the width of the second mesa structure may be 1.2 to 2 times the width of the first mesa structure.

In an embodiment, the first mesa structure may further include an electric field adjusting layer under the electric field buffer layer.

In an embodiment, the second mesa structure may further include an electric field adjusting layer on the grading layer.

In an embodiment, the optical detection device may further include a substrate where the first ohmic contact layer is disposed on a front side of the substrate, wherein the first ohmic contact layer may be an n-type ohmic contact layer, and the second ohmic contact layer may be a p-type ohmic contact layer, wherein the second mesa structure may be disposed on the first ohmic contact layer.

In an embodiment, the optical detection device may further include: a microlens on a back side of the substrate; and a coating film covering the microlens and the back side of the substrate.

In an embodiment, the second ohmic contact layer may be disposed on the first mesa structure and may be vertically overlapped with the diffusion layer.

In an embodiment, the optical detection device may further include a passivation film covering at least a portion of the first ohmic contact layer and the first and second mesa structures.

In an embodiment, the passivation film may expose the second ohmic contact layer.

In an embodiment, the optical detection device may further include a first electrode disposed on the second ohmic contact layer exposed by the passivation film.

In an embodiment, the optical detection device may further include a second electrode disposed on the first ohmic contact layer exposed by the passivation film.

In an embodiment, the electric field buffer layer may include undoped InP and the electric field adjusting layer may include silicon-doped InP.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
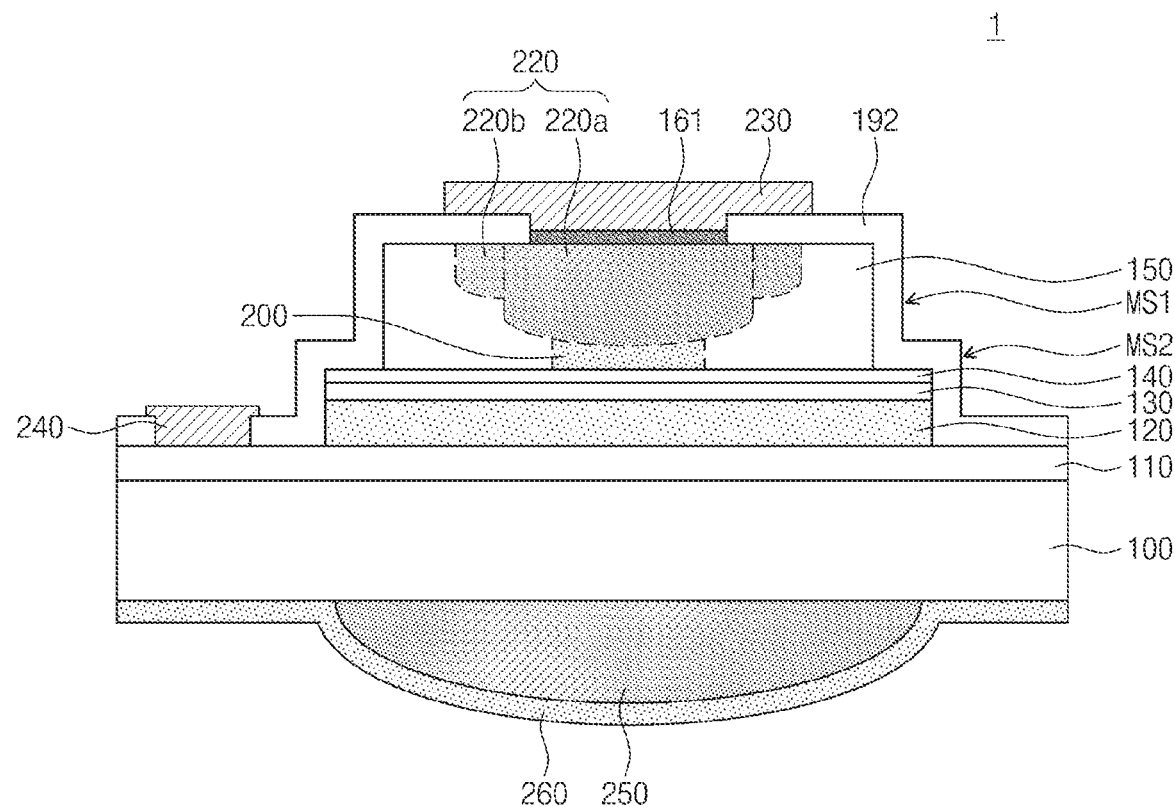
FIG. 1 is a view showing an optical detection device according to an embodiment of the inventive concept.

Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Further, the inventive concept is only defined by scopes of claims. Like reference numbers refer to like elements throughout the entire specification.

The terms used in this specification are used only for explaining specific embodiments while not limiting the inventive concept. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, embodiments described in this specification will be described with plan views sectional views, that is, ideal exemplary views of the inventive concept. In the drawings, the thicknesses of a layer and an area are exaggerated for effective description. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the inventive concept.

FIG. 1 is a view showing an optical detection device 1 according to an embodiment of the inventive concept. The optical detection device 1 may be, for example, an avalanche photodiode. The optical detection device 1 may include a substrate 100, a first ohmic contact layer 110, first and second mesa structures MS1 and MS2, a second ohmic contact layer 161, a passivation film 192, a first electrode 230, a second electrode 240, a microlens 250, and a coating film 260.

The substrate 100 may be a semi-insulating substrate. The substrate 100 may be, for example, an InP substrate.

The first ohmic contact layer 110 may be disposed on the substrate 100. The first ohmic contact layer 110 may be disposed on a first side (e.g., a front side) of the substrate 100. The first ohmic contact layer 110 may have a first conductivity type. As an example, the first ohmic contact layer 110 may be an n-type ohmic contact layer.

The second mesa structure MS2 may be disposed on the first ohmic contact layer 110. The second mesa structure MS2 may include a sequentially stacked light absorbing layer 120, a grading layer 130, and an electric field adjusting layer 140.

The light absorbing layer 120 may be provided in an undoped state. As an example, the light absorbing layer 120 may include InGaAs.

The grading layer 130 may alleviate the band gap difference between the light absorbing layer 120 and the electric field adjusting layer 140. Although the grading layer 130 is shown as being provided as a single layer for the sake of simplicity, the grading layer 130 may be provided in a multi-layer structure having different band gaps. For example, the grading layer 130 may include a structure in which InGaAsP layers having different band gaps are stacked according to different composition ratios. The grading layer 130 may include a quantum well and a superlattice structure.

The electric field adjusting layer 140 may include InP. The electric field adjusting layer 140 may be provided in a doped state. The electric field adjusting layer 140 may be formed by doping silicon. In one example, the electric field adjusting layer 140 has a thickness of about 0.01 um to about 2.0 um, and the doping concentration of the impurity may be a value of about $1.0 \times 10^{16}$ cm$^{-3}$ to about $1.0 \times 10^{18}$ cm$^{-3}$.

The first mesa structure MS1 may be disposed on the second mesa structure MS2. The first mesa structure MS 1 may include an electric field buffer layer 150, a diffusion layer 220, and an amplification layer 200.

The electric field buffer layer 150 may be disposed on the electric field adjusting layer 140. The electric field buffer layer 150 may be provided in an undoped state. As an example, the electric field buffer layer 150 may include InP.

The diffusion layer 220 may be formed inside the electric field buffer layer 150. The diffusion layer 220 may include a first diffusion layer 220a and a second diffusion layer 220b. The first and second diffusion layers 220a and 220b may be doped with p-type dopants.

The amplification layer 200 may be formed within the electric field buffer layer 150. The amplification layer 200 indicates a region where the avalanche amplification is performed, and does not mean a separate layer. For example, an inner region of the electric field buffer layer 150 between the first diffusion layer 220a and the electric field adjusting layer 140 may function as an amplification layer.

The width of the second mesa structure MS2 may be greater than the width of the first mesa structure MS1. The width of the second mesa structure MS2 may be about 1.2 to 2 times the width of the first mesa structure MS1. The width of the second mesa structure MS2 may be about 1.5 times the width of the first mesa structure MS1. In the drawings, the configurations are shown for clarity and may be different from the actual sizes and ratios of the components.

The second ohmic contact layer 161 may be disposed on the first mesa structure MS1. The second ohmic contact layer 161 may be disposed on the electric field buffer layer 150 and vertically overlapped with the diffusion layer 220. The second ohmic contact layer 161 may have a second conductivity type. As an example, the second ohmic contact layer 161 may be a p-type ohmic contact layer. The second ohmic contact layer 161 may reduce the forward resistance of the optical detection device 1.

The passivation film 192 may be disposed on the first mesa structure MS1, the second mesa structure MS2, and the first ohmic contact layer 110. The passivation film 192 may cover the first mesa structure MS1 and the second mesa structure MS2 except for the second ohmic contact layer 161. The passivation film 192 may prevent the leakage current of the optical detection device 1 from being generated. The passivation film 192 may include silicon nitride or polyimide.

The first electrode 230 may be disposed on the second ohmic contact layer 161. As one example, the first electrode 230 may be disposed on the second ohmic contact layer 161 exposed by the passivation film 192 and a portion of the passivation film 192. The first electrode 230 may be a p-type electrode.

The second electrode 240 may be disposed on the first ohmic contact layer 110. For example, the second electrode 240 may be disposed on the first ohmic contact layer 110 exposed by the passivation film 192. The second electrode 240 may be an n-type electrode.

The microlens 250 may be disposed on the substrate 100. The microlens 250 may be disposed on a second side (e.g., a back side) of the substrate 100. The microlens 250 may collect the light incident on the optical detection device 1.

The coating film 260 may be disposed on the microlens 250 and the second side of the substrate 100. The coating film 260 may be disposed to cover the microlens 250 and the second side of the substrate 100. The coating film 260 may prevent reflection of light incident on the substrate 100.

The optical detection device 1 according to an embodiment of the inventive concept includes the advantages of the mesa structure and also includes the advantage of the flat structure by forming the amplification layer 200 using the diffusion layer 220. More specifically, the capacitance in the p-type and n-type junction regions and the parasitic capacitance due to the p-type electrode may be reduced through the mesa structure, and the dark current level may be lowered through the flat structure.

Further, by applying the mesa structure to the second order, the region in which the avalanche photodiode operates may be further defined. The central region of the optical detection device 1 may define the region in which the avalanche photodiode operates. By defining the region where amplification occurs, the electric field signal may be concentrated in the central region and edge breakdown phenomenon may be prevented. Unlike this, if a buried avalanche photodiode is formed without applying a mesa structure, a guard ring may be required to prevent edge breakdown.

FIGS. 2 to 12 are views showing a process of manufacturing the optical detection device 1 of FIG. 1. Hereinafter, a method of manufacturing the optical detection device 1 will be described with reference to FIGS. 1 and 12.

Figure 2:
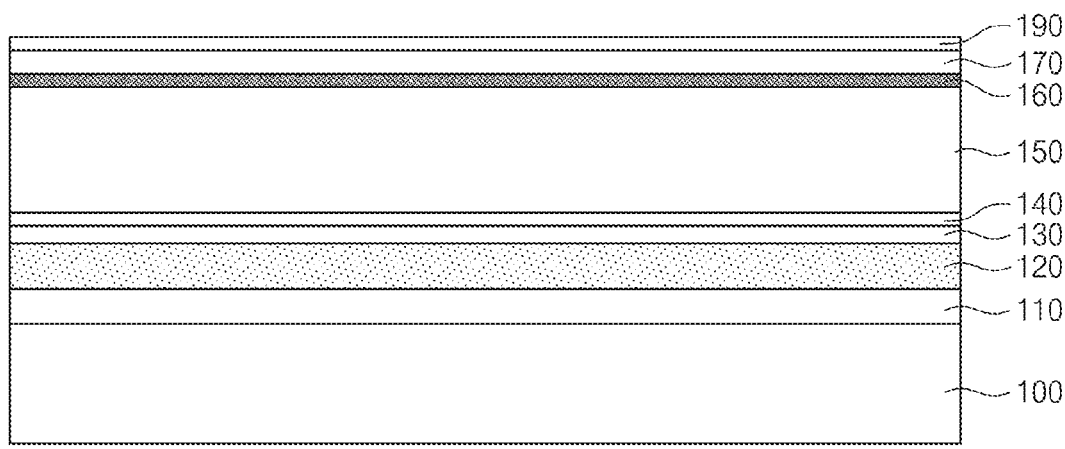
FIGS. 2 to 12 are views showing a process of manufacturing an optical detection device of FIG. 1.

Referring to FIG. 2, prepared is a layer-stacked structure in which a substrate 100, a first ohmic contact layer 110, a light absorbing layer 120, a grading layer 130, an electric field adjusting layer 140, an electric field buffer layer 150, a first diffusion control layer 160, a second diffusion control layer 170, and a silicon nitride layer 190 are sequentially stacked. The substrate 100 may be an InP substrate, the first ohmic contact layer 110 may be an n-type ohmic contact layer, and the light absorbing layer 120 may include undoped InGaAs. The grading layer 130 may include InGaAsP having various band gaps, the electric field adjusting layer 140 may be InP doped with silicon, and the electric field buffer layer 150 may include undoped InP. The first diffusion control layer 160 may include InGaAs, and the second diffusion control layer 170 may include InP.

Figure 3:
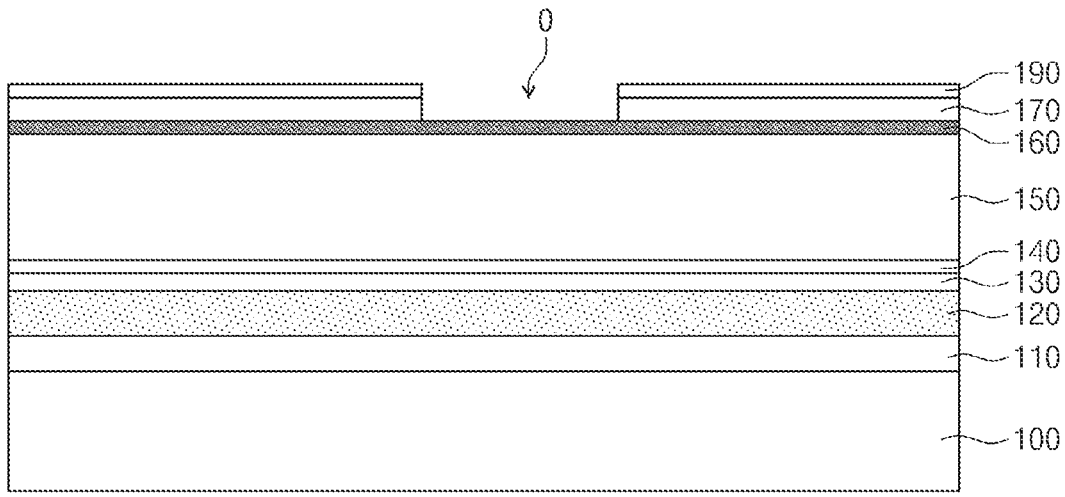

Referring to FIG. 3, the second diffusion control layer 170 and the silicon nitride layer 190 may be patterned to form an opening O. The second diffusion control layer 170 and the silicon nitride layer 190 may be etched to form an opening O exposing a portion of the first diffusion control layer 160.

Figure 4:
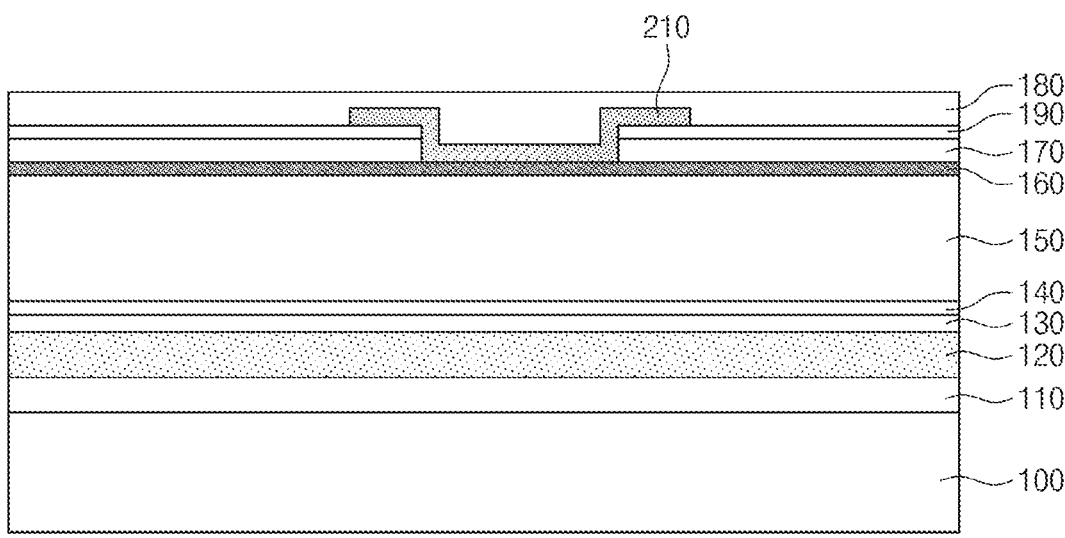

Referring to FIG. 4, a P-type doping material 210 may be formed on a portion of the first diffusion control layer 160 exposed by the opening. The P-type doping material 210 may include a P-type dopant. For example, the P-type doping material 210 may include zinc (Zn) or cadmium (Cd), but the inventive concept is not limited thereto. After the P-type doping material 210 is deposited, a silicon oxide layer 180 covering the P-type doping material 210 and the silicon nitride layer 190 may be formed. The silicon oxide layer 180 may prevent loss of the P-type doping material 210 due to heat when the heat treatment process is performed thereafter.

Figure 5:
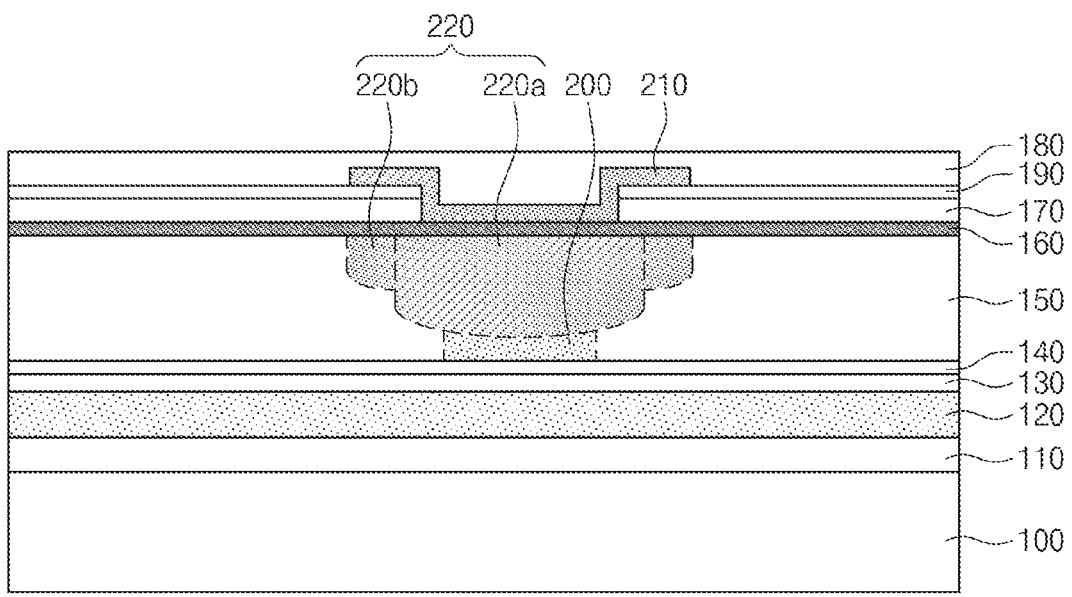

Referring to FIG. 5, a diffusion layer 220 may be formed by performing a heat treatment process. The diffusion layer 220 may be formed through a diffusion process, for example, an annealing process and an activation process. A portion of the P-type doping material 210 diffused through the first diffusion control layer 160 may forms a first diffusion layer 220a and another portion of the P-type doping material 210 diffused through the first diffusion control layer 160, the second diffusion control layer 170 and the silicon nitride layer 190 may form a second diffusion layer 220b. Accordingly, the first diffusion layer 220a and the second diffusion layer 220b having different depths may be formed. The first and second diffusion layers 220a and 220b may be doped with p-type dopants. As an example, p-type dopants may be provided at a concentration of about $2.0 \times 10^{17}$ cm$^{-3}$. The diffusion layer 220 is formed in a double layer, so that the electric field concentration phenomenon of the corner portion may be prevented.

Figure 6:
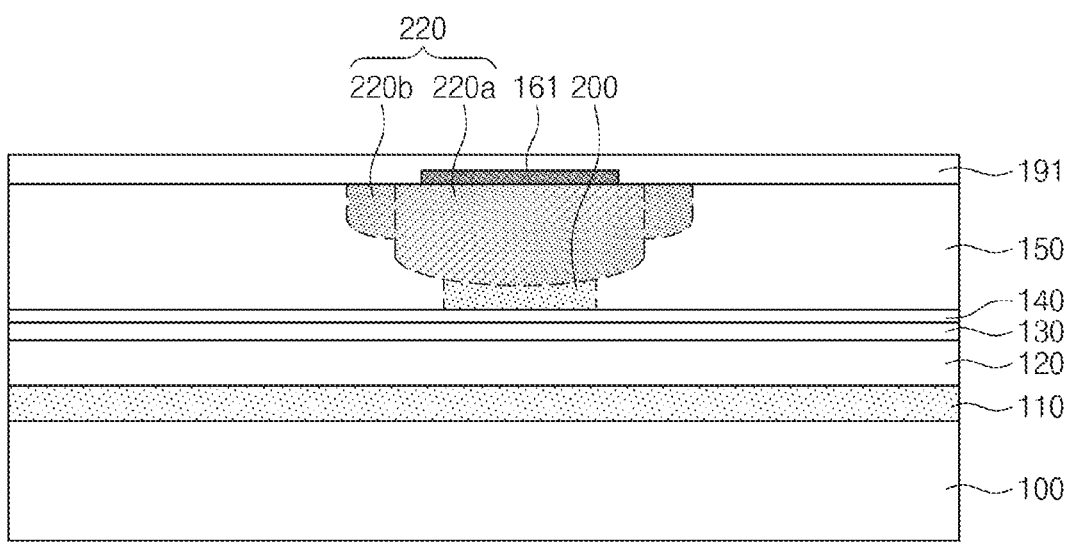

Referring to FIG. 6, a second ohmic contact layer 161 may be formed. The second ohmic contact layer 161 may be formed by doping a portion of the first diffusion control layer 160 with the P-type doping material 210.

More specifically, after the diffusion layer 220 is formed, the P-type doping material 210, the silicon nitride layer 190, and the silicon oxide layer 180 may be removed. The first diffusion control layer 160 may be patterned to form the second ohmic contact layer 161. A preliminary passivation film 191 may be formed on the second ohmic contact layer 161 and the electric field buffer layer 150. The preliminary passivation film 191 may include silicon nitride or polyimide.

Figure 7:
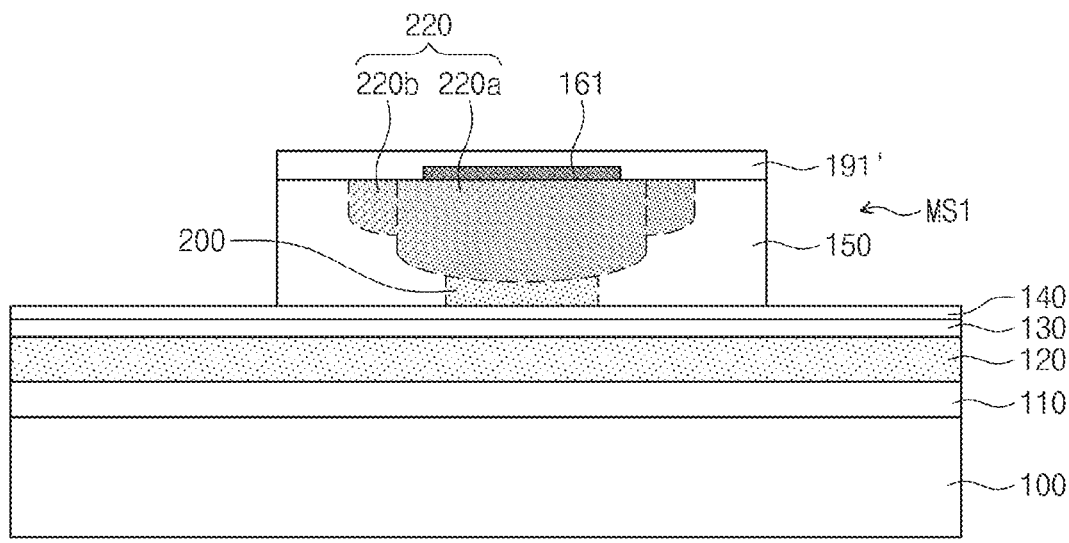
Figure 8:
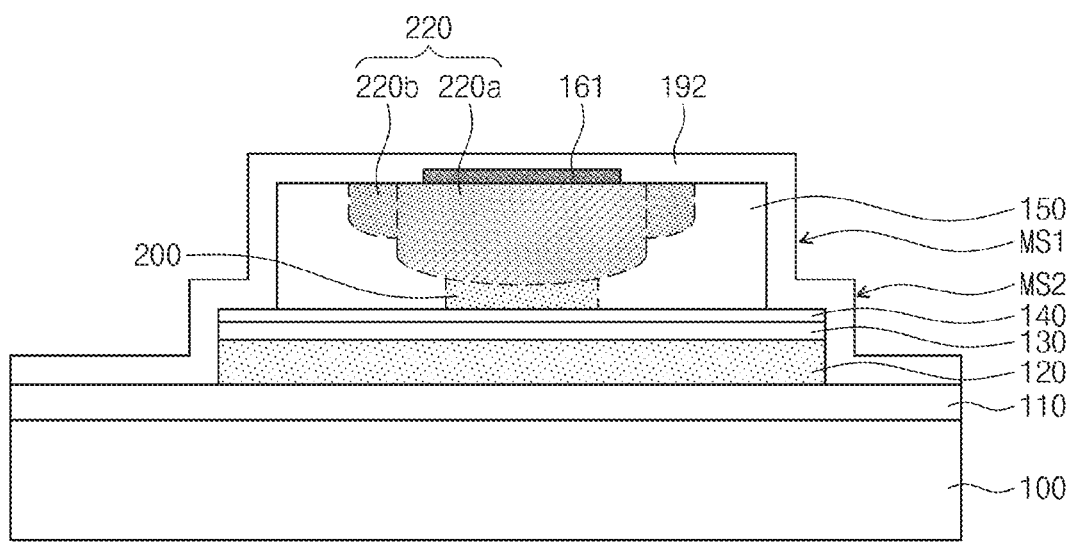

Referring to FIGS. 7 and 8, a first mesa structure MS1 may be formed, and then a second mesa structure MS2 may be formed. The first and second mesa structures MS1 and MS2 may be formed through an etching process. The width of the second mesa structure MS2 may be greater than the width of the first mesa structure MS1. The width of the second mesa structure MS2 may be about 1.2 to 2 times the width of the first mesa structure MS1. The width of the second mesa structure MS2 may be about 1.5 times the width of the first mesa structure MS1. The preliminary passivation film 191 may be etched together with the electric field buffer layer 150 to form the preliminary passivation pattern 191' and after forming the second mesa structure MS2, additional passivation material may be deposited to form a passivation film 192. The passivation material is the same as the material for forming the preliminary passivation film and is not shown as a separate layer for simplicity of illustration.

Figure 9:
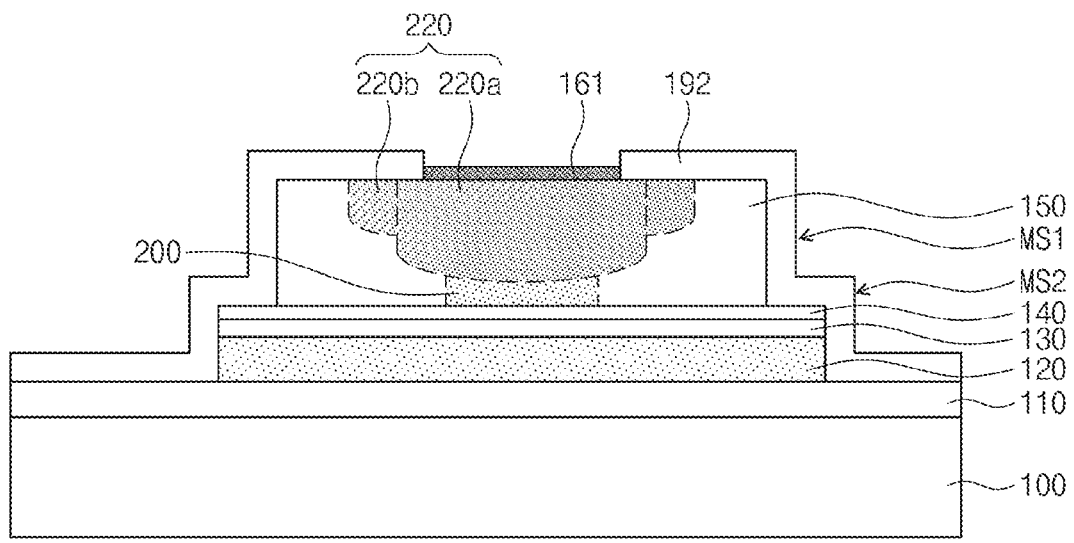
Figure 10:
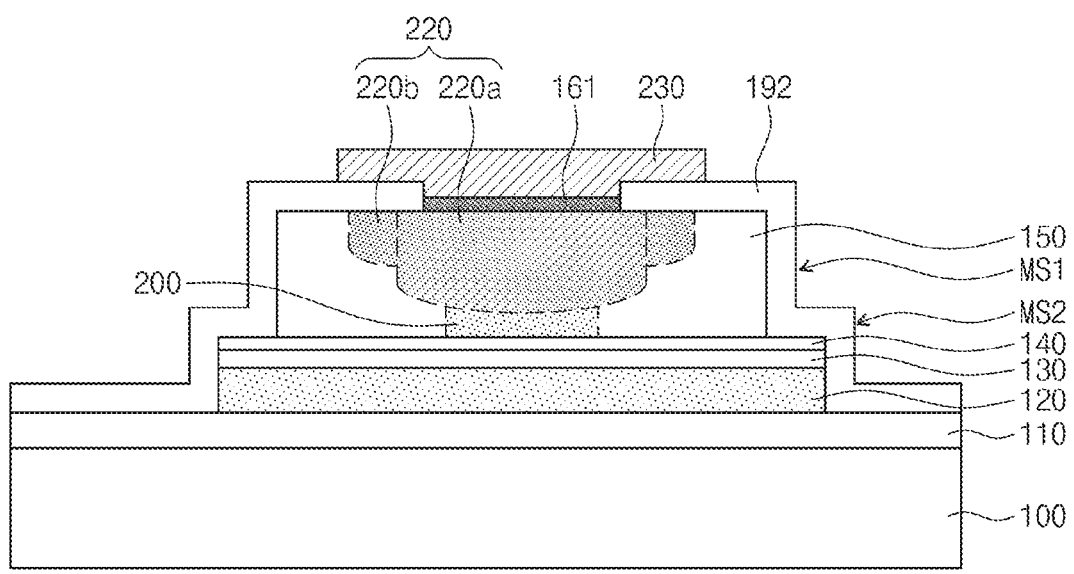

Referring to FIGS. 9 and 10, the passivation film 192 may be patterned to expose at least a portion of the second ohmic contact layer 161. Then, the first electrode 230 may be formed on the second ohmic contact layer 161 and the passivation film 192. The first electrode 230 may be a p-type electrode.

Figure 11:
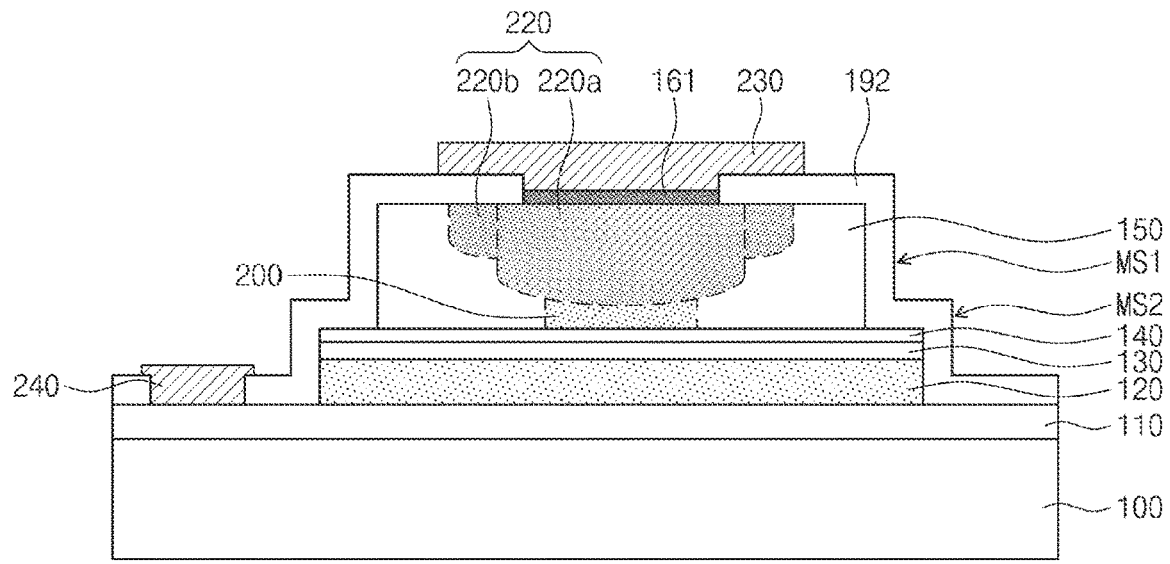
Figure 12:
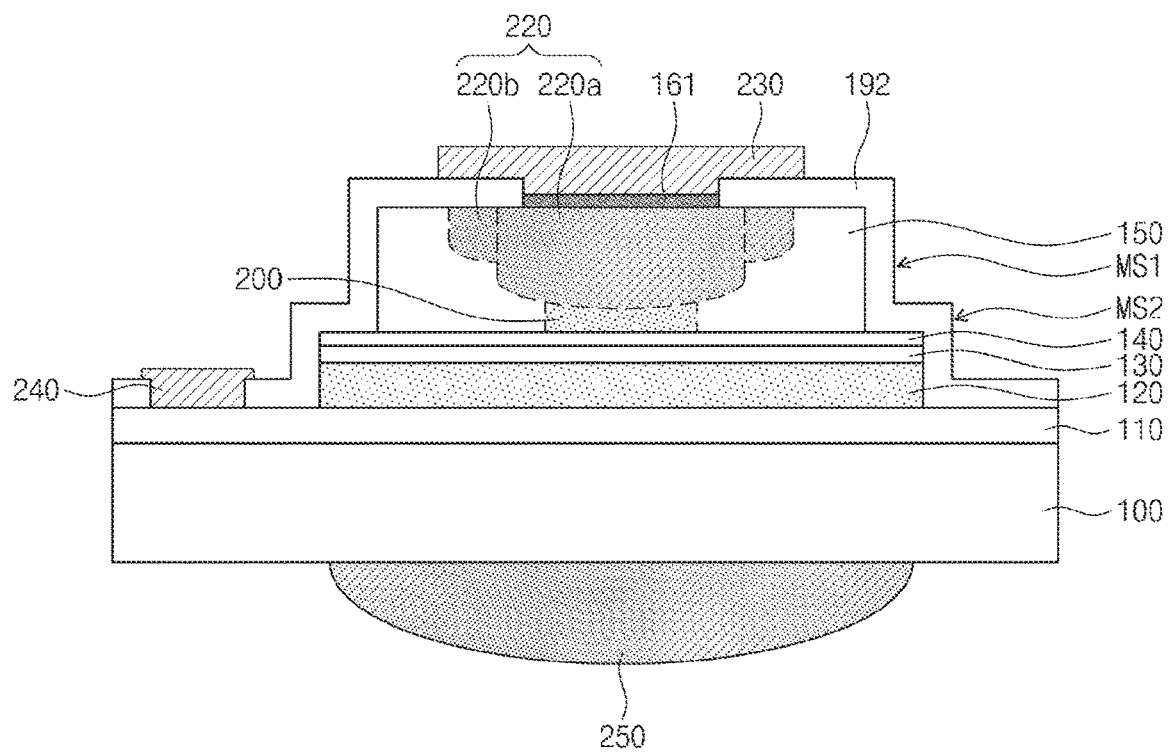

Referring to FIGS. 11 and 12, another portion of the passivation film 192 is patterned to expose a portion of the first ohmic contact layer 110, and form the second electrode 240 on the exposed first ohmic contract layer 110. The second electrode 240 may be an n-type electrode. The microlens 250 may be formed on the back side of substrate 100. After lapping and polishing the back side of the substrate 100, the microlens 250 may be formed.

Then, the optical detection device 1 of FIG. 1 may be fabricated by forming a coating film 260 for covering the back side of the substrate 100 and the microlens 250.

Figure 13:
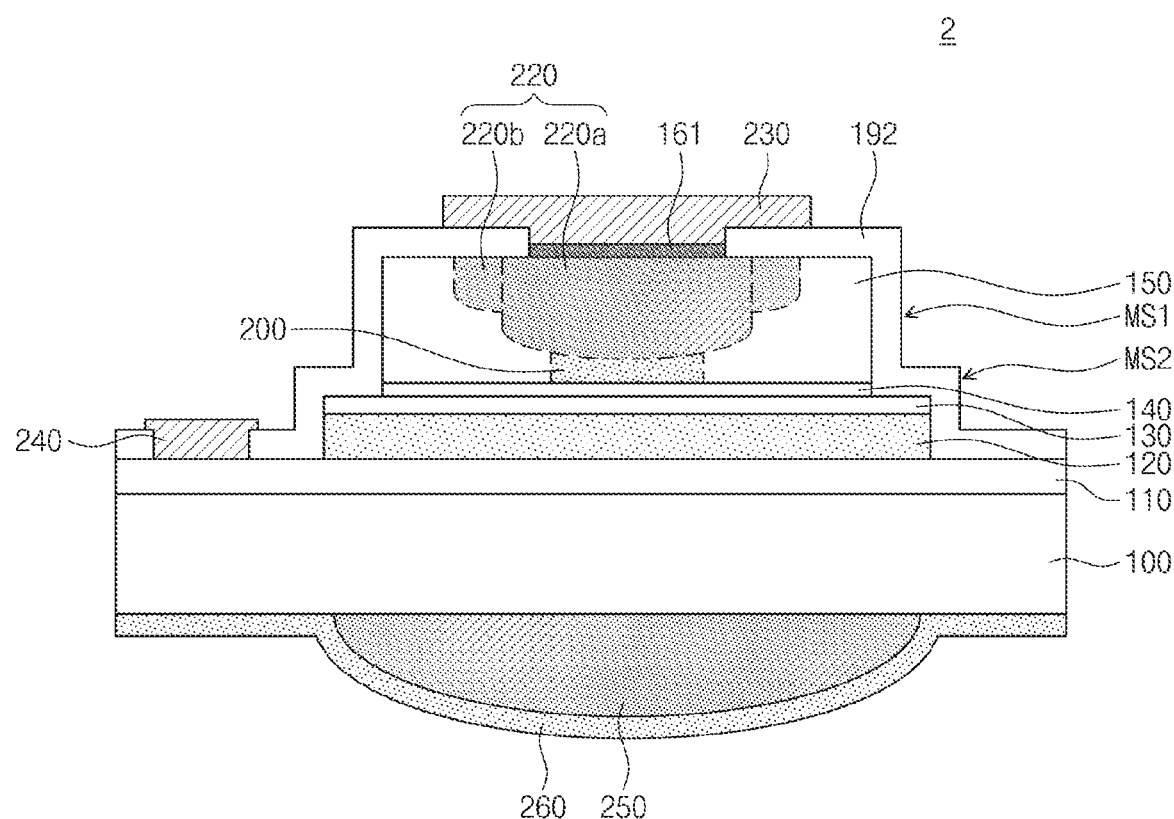
FIG. 13 is a view showing an optical detection device according to an embodiment of the inventive concept.

FIG. 13 is a view showing an optical detection device 2 according to an embodiment of the inventive concept. The same reference numerals are provided for substantially the same configurations as those of the optical detection device 1 described with reference to FIGS. 1 to 12, and redundant explanations may be omitted for the sake of simplicity of explanation.

The first mesa structure MS1 of the optical detection device 2 may further include an electric field adjusting layer 140 under the electric field buffer layer 150. In other words, the first mesa structure MS1 may include an electric field buffer layer 150, an electric field adjusting layer 140, a diffusion layer 220, and an amplification layer 200, and the second mesa structure MS2 may include a light absorbing layer 120 and a grading layer 130.

According to embodiments of the inventive concept, an optical detection device including the advantages of a mesa structure and a flat structure may be provided. Further, by applying the mesa structure to the secondarily, the region in which the avalanche photodiode operates may be further defined. The central region of the optical detection device may define the region in which the avalanche photodiode operates.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. An optical detection device comprising:
   a first ohmic contact layer of a first conductivity type;
   a second ohmic contact layer of a second conductivity type; and
   first and second mesa structures stacked between the first and second ohmic contact layers,
   wherein the first mesa structure comprises:
   an electric field buffer layer;

a diffusion layer formed in the electric field buffer layer, the diffusion layer including a first diffusion layer and a second diffusion layer surrounding a portion of the first diffusion layer, the first diffusion layer having a greater depth than the second diffusion layer; and an amplification layer disposed between the first diffusion layer and second mesa structure, the amplification layer narrower than the first diffusion layer to have a width smaller than a width of the first diffusion layer, wherein the second mesa structure comprises:

a light absorbing layer; and a grading layer on the light absorbing layer.

2. The optical detection device of claim 1, wherein the first mesa structure is disposed on the second mesa structure.

3. The optical detection device of claim 1, wherein a width of the second mesa structure is larger than a width of the first mesa structure.

4. The optical detection device of claim 3, wherein the width of the second mesa structure is 1.2 to 2 times the width of the first mesa structure.

5. The optical detection device of claim 3, wherein the second mesa structure further comprises an electric field adjusting layer under the electric field buffer layer.

6. The optical detection device of claim 3, wherein the second mesa structure further comprises an electric field adjusting layer on the grading layer.

7. The optical detection device of claim 1, further comprising a substrate where the first ohmic contact layer is disposed on a front side of the substrate, wherein the first ohmic contact layer is an n-type ohmic contact layer, and the second ohmic contact layer is a p-type ohmic contact layer, wherein the second mesa structure is disposed on the first ohmic contact layer.

8. The optical detection device of claim 7, further comprising:

a microlens on a back side of the substrate; and a coating film covering the microlens and the back side of the substrate.

9. The optical detection device of claim 1, wherein the second ohmic contact layer is disposed on the first mesa structure and is vertically overlapped with the diffusion layer.

10. The optical detection device of claim 9, further comprising a passivation film covering at least a portion of the first ohmic contact layer and the first and second mesa structures.

11. The optical detection device of claim 10, wherein the passivation film exposes the second ohmic contact layer.

12. The optical detection device of claim 10, further comprising a first electrode disposed on the second ohmic contact layer exposed by the passivation film.

13. The optical detection device of claim 10, further comprising a second electrode disposed on the first ohmic contact layer exposed by the passivation film.

14. The optical detection device of claim 5, wherein the electric field buffer layer comprises undoped InP and the electric field adjusting layer comprises silicon-doped InP.

15. The optical detection device of claim 5, wherein an inner region of the electric field buffer layer between the first diffusion layer and the electric field adjusting layer functions as the amplification layer.

* * * * *